United States Patent
Harada

(10) Patent No.: US 7,586,388 B2
(45) Date of Patent: Sep. 8, 2009

(54) FILTER MODULE AND COMMUNICATION APPARATUS

(75) Inventor: Tetsuro Harada, Otsu (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/254,895

(22) Filed: Oct. 21, 2008

(65) Prior Publication Data

US 2009/0033437 A1    Feb. 5, 2009

Related U.S. Application Data

(63) Continuation of application No. PCT/JP2007/061519, filed on Jun. 7, 2007.

(30) Foreign Application Priority Data

Jul. 5, 2006    (JP) .............................. 2006-185673

(51) Int. Cl.
  H03H 7/46    (2006.01)
  H03H 9/70    (2006.01)
  H03H 9/72    (2006.01)
  H01P 1/213   (2006.01)

(52) U.S. Cl. ................... 333/132; 333/133; 333/101; 455/78; 455/552.1

(58) Field of Classification Search ................. 333/101, 333/126, 129, 132, 133; 455/78, 83, 552.1
See application file for complete search history.

(56) References Cited

U.S. PATENT DOCUMENTS

| | | | |
|---|---|---|---|
| 6,995,630 B2* | 2/2006 | Satoh et al. | 333/133 |
| 7,035,602 B2* | 4/2006 | Satoh et al. | 455/118 |
| 7,049,906 B2* | 5/2006 | Wilcox | 333/126 |
| 7,242,268 B2* | 7/2007 | Hagiwara et al. | 333/133 |
| 7,253,702 B2* | 8/2007 | Kemmochi et al. | 333/133 |
| 7,498,902 B2* | 3/2009 | Harada et al. | 333/133 |
| 2006/0044080 A1 | 3/2006 | Hagiwara et al. | |
| 2006/0194550 A1* | 8/2006 | Block et al. | 455/78 |

FOREIGN PATENT DOCUMENTS

| | | |
|---|---|---|
| JP | 2001-044702 A | 2/2001 |
| JP | 2002-198855 A | 7/2002 |

OTHER PUBLICATIONS

Official Communication issued in International Patent Application No. PCT/JP2007/061519, mailed on Sep. 18, 2007.

* cited by examiner

*Primary Examiner*—Barbara Summons
(74) *Attorney, Agent, or Firm*—Keating & Bennett, LLP

(57) ABSTRACT

In a filter module, a common input/output portion of a switch circuit is set as a first port. A first filter arranged to pass a signal in a first frequency band is connected between a first input/output portion of the switch circuit and a second port. A second filter arranged to pass a signal in a second frequency band is connected between a second input/output portion and the second port. A phase adjusting circuit is provided such that an impedance in the second frequency band as seen from the first port while the switch circuit selects the first input/output portion is in a substantially short-circuited state. This arrangement prevents leakage of unwanted signals from a signal path used in a communication system not in operation among two communication systems for different frequency bands while the other communication system is engaged in communication.

7 Claims, 11 Drawing Sheets freq (735.0MHz to 1.000GHz)

freq (735.0MHz to 1.000GHz)

FILTER MODULE AND COMMUNICATION APPARATUS

BACKGROUND OF THE INVENTION

1. Field of the Invention

The present invention relates to filter modules that perform input/output of two signals in different frequency bands and to communication apparatuses including such filter modules.

2. Description of the Related Art

Presently, mobile phones use various communication systems, such as GSM and DCS. Accordingly, devices capable of dual-band or triple-band applications that are compatible with a plurality of systems have been developed for mobile phones. In such mobile phones, switching circuits for switching systems and filters for removing signals having frequencies other than operating frequencies.

Such a multi-band filter module which performs input/output of two signals in different frequency bands is disclosed in Japanese Unexamined Patent Application Publication No. 2004-166258.

FIG. 1 illustrates an example of a configuration of a filter module disclosed in Japanese Unexamined Patent Application Publication No. 2004-166258.

In FIG. 1, a first port 100a of a first high-frequency switch 10a is connected to an unbalanced port P1 of the filter module. This high-frequency switch 10a includes three ports. A second port 100b of the first high-frequency switch 10a is connected to an unbalanced port 110a of a first balanced-unbalanced bandpass filter 20a. A third port 100c is connected to an unbalanced terminal 120a of a second balanced-unbalanced bandpass filter 20b. The first and second balanced-unbalanced bandpass filters 20a and 20b are connected to a second high-frequency switch 10b and a third high-frequency switch 10c each including three ports.

A first port 130a of the second high-frequency switch is connected to a first balanced port P2-1 of the filter module. A second port 130b of the second high-frequency switch is connected to a first balanced port 10b of the first balanced-unbalanced bandpass filter 20a. A third port 130c of the second high-frequency switch is connected to a first balanced port 120b of the second balanced-unbalanced bandpass filter 20b.

A first port 150a of the third high-frequency switch is connected to a second balanced port P2 of the filter module. A second port 150b of the third high-frequency switch is connected to a second balanced port 110c of the first balanced-unbalanced bandpass filter 20a. A third port 150c of the third high-frequency switch is connected to a second balanced port 120c of the second balanced-unbalanced bandpass filter 20b.

In a circuit disclosed in Japanese Unexamined Patent Application Publication No. 2004-166258, the two filters that are compatible with a plurality of systems and the first to third switches arranged to switch between these systems are used. Thus, communication is enabled by switching to either one of the filters that are arranged to pass signals at desired communication frequencies.

Such a circuit has a problem of being relatively large since it requires the switches 10b and 10c at both the input and output sides.

To address this problem, it may be possible to provide a switch at only one of the input portion and the output portion. However, with such a configuration in which switching is performed using only a switch circuit provided at the input side or output side of the filter, signals that leak from the switch to a filter that is not selected by the switch may be transmitted. Thus, it is likely that signals at frequencies corresponding to the filter that is not selected will be leaked. Therefore, there is a possibility of a communication failure or other malfunction due to the unwanted signals leaking into a currently operating system from another system.

SUMMARY OF THE INVENTION

To overcome the problems described above, preferred embodiments of the present invention provide a filter module which prevents leakage of unwanted signals from a signal path used in a communication system not in operation among two communication systems used for different frequency bands while the other communication system is in operation so as to improve the selectivity, and a communication apparatus including the filter module.

A filter module according to a preferred embodiment of the present invention includes a switch circuit including first and second input/output portions and a common input/output portion connected to a first port, a first filter arranged to pass a signal in a first frequency band between the first input/output portion of the switch circuit and a second port and a second filter arranged to pass a signal in a second frequency band between the second input/output portion of the switch circuit and the second port. In the filter module, an impedance in the second frequency band as seen from the first port while the switch circuit selects the first image pickup portion is in a substantially short-circuited state.

The first and second filters preferably have a balanced to unbalanced conversion function. The second port is a balanced terminal. The first and second filters input and output signals to and from the second port in a balanced state.

The switch circuit is preferably integrated into a laminate including a plurality of dielectric layers. The first and second filters are preferably surface acoustic wave filters or thickness extensional vibration piezoelectric filters mounted on the laminate.

A phase adjusting circuit is preferably provided between the first input/output portion of the switch circuit and the first filter, such that an impedance in the second frequency band as seen from the first port while the switch circuit selects the first input/output portion is in a substantially short circuited state.

The phase adjusting circuit preferably includes one of a transmission line, a capacitor, and an inductor.

The switch circuit preferably includes a capacitor and an inductor. The phase adjusting circuit is preferably defined by a transmission line. The transmission line of the phase adjusting circuit is preferably disposed on a different layer from a layer having the capacitor or the inductor of the switch circuit disposed thereon.

A communication apparatus according to another preferred embodiment of the present invention includes the filter module described above in a high-frequency circuit portion thereon.

Since the impedance in the second frequency band as seen from the first port while the switch circuit selects the first input/output portion is preferably in a substantially short-circuited state, a signal leaked from the second filter and the switch circuit and transmitted is short-circuited and does not pass between the first port and the second port. Thus, the selectivity of signals in the first and second frequency bands can be improved.

By using filters having a balanced to unbalanced conversion function such as the first and second filters, balanced input and output of a signal can be performed without using a balanced to unbalanced transformer, such as a balun. Thus, the size of the entire module can be reduced.

The switch circuit is preferably integrated into a laminate including a plurality of dielectric layers, and the first and second filters defined by surface acoustic wave filters or thickness extensional vibration piezoelectric filters are mounted on the laminate. This configuration enables fabrication of a filter module with a reduced size and high frequency selectivity.

A phase adjusting circuit is preferably provided between the first input/output portion of the switch circuit and the first filter, such that an impedance in the second frequency band as seen from the first port while the switch circuit selects the first input/output portion is in a substantially short-circuited state. This phase adjusting circuit rotates the impedance as seen from the first port on a Smith chart and can easily bring the impedance close to a short circuit. Therefore, pass-through of signals leaked from the second filter and the switch circuit can be effectively prevented.

The phase adjusting circuit preferably includes one of a transmission line, a capacitor, and an inductor. This facilitates mounting of the phase adjusting circuit together with elements defining the switch circuit. Thus, a size increase caused by the mounting of the phase adjusting circuit can be prevented.

The transmission line defining the phase adjusting circuit is preferably disposed on a different layer from a layer having the capacitor or the inductor of the switch circuit disposed thereon. With this arrangement, the capacitor and the inductor and the transmission line of the phase adjusting circuit do not adversely affect each other, and the size of the entire module can be further reduced.

A small size, low cost communication apparatus processing a plurality of communication signals having different frequency bands can be fabricated by providing the filter module described above in a high-frequency circuit portion thereof.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

First Preferred Embodiment

Figure 1:
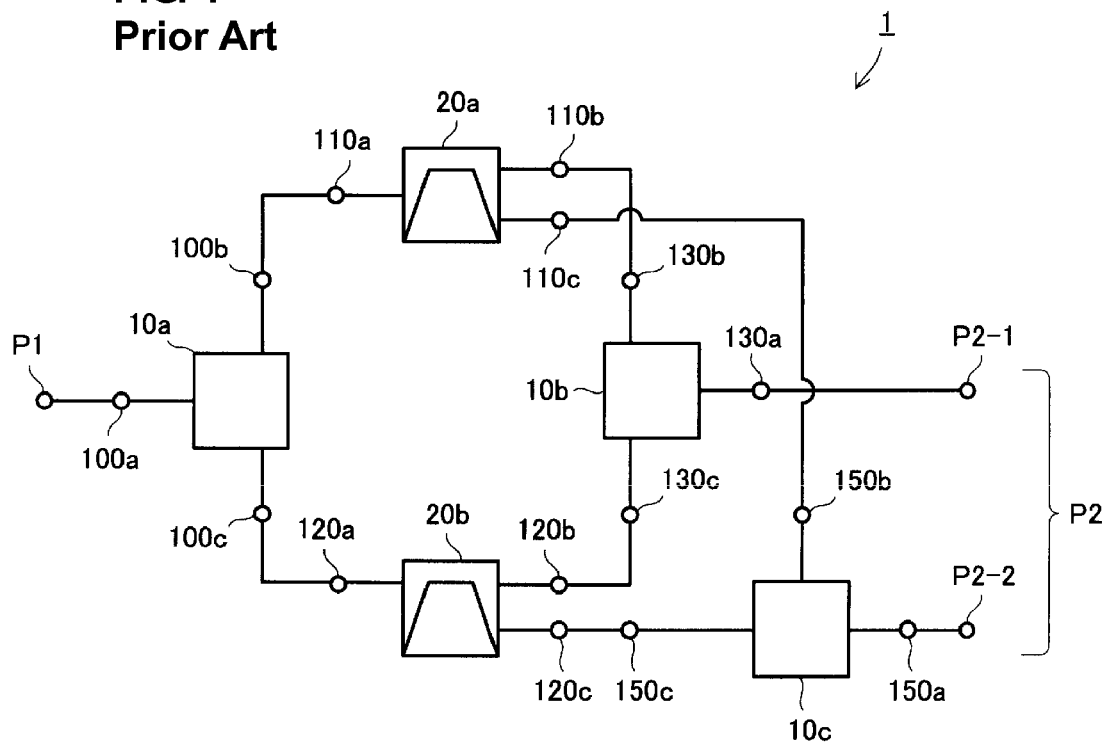
FIG. 1 is a diagram illustrating a configuration of a filter module according to the related art.
Figure 2:
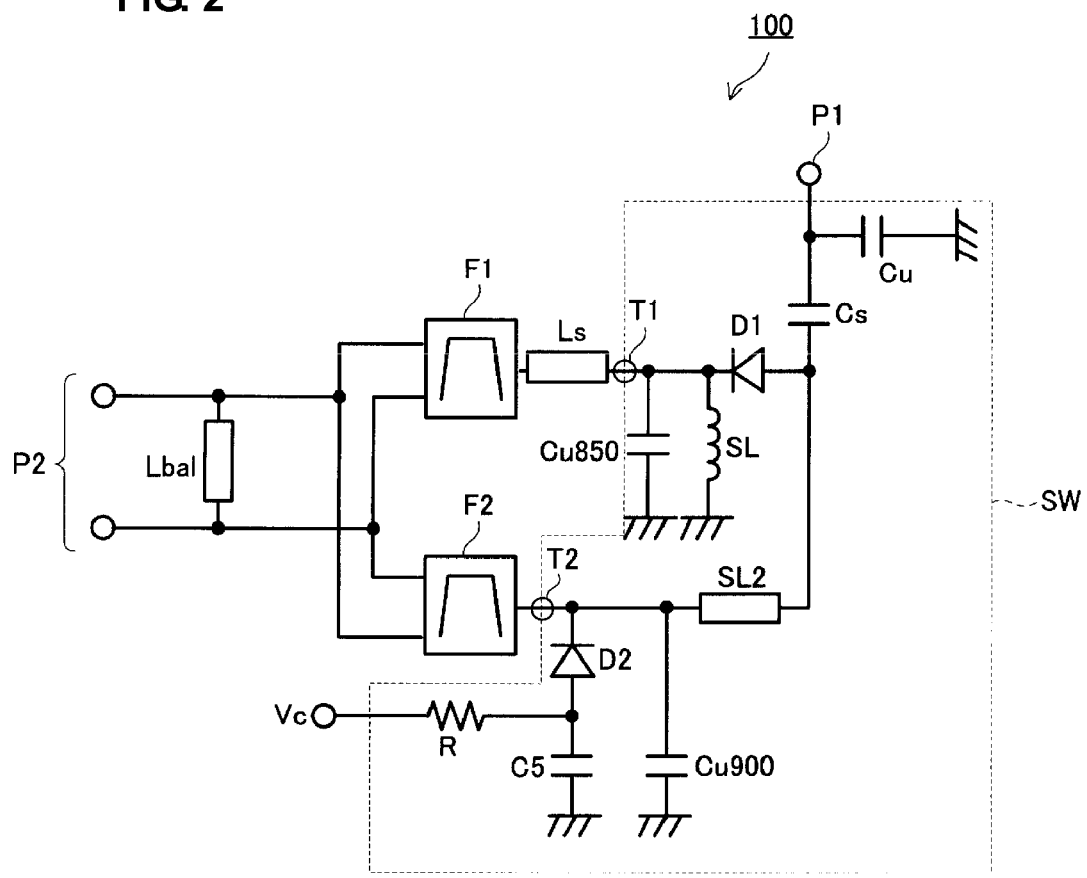
FIG. 2 is a circuit diagram of a filter module according to a first preferred embodiment of the present invention.

FIG. 2 is a circuit diagram illustrating a filter module according to a first preferred embodiment of the present invention. The filter module 100 includes a first input/output port P1 arranged to input and output a signal in an unbalanced state, a second input/output port P2 arranged to input and output a signal in a balanced state, and a control terminal Vc arranged to switch frequency bands. The filter module 100 primarily includes a first filter F1, a second filter F2, and a switch circuit SW.

The switch circuit SW includes a common input/output portion connected to the first port P1, a first input/output portion T1, and a second input/output portion T2. The first filter F1 passes a signal in a first frequency band (e.g., 850 MHz) and is provide between the first input/output portion T1 of the switch circuit SW and the second port P2. The second filter F2 passes a signal in a second frequency band (e.g., 900 MHz) and is provided between the second input/output portion T2 of the switch circuit SW and the second port P2.

A phase adjusting circuit Ls is provided between the first input/output portion T1 and the first filter F1. A matching element (e.g., an inductor) Lbal is provided between balanced terminals of the second port P2.

A diode D1 is provided in series between the first input/output portion T1 of the switch circuit SW and the first port P1 via a capacitor Cs. An inductor SL defining a path to apply a direct current control voltage and a capacitor Cu850 which resonates with the inductor SL are provided between the cathode side of the diode D1 and ground. A matching capacitor Cu is provided at the first port P1.

A diode D2 is provided between the second input/output portion T2 and ground and is connected to a shunt via a capacitor C5. In addition, a matching capacitor Cu900 is connected between the second input/output portion T2 and ground. A stripline SL2 having an electrical length substantially equal to a quarter wavelength in the 850 MHz band, for example, is provided between the connection point of the anode of the diode D1 and the capacitor Cs, and the cathode of the diode D2.

A resistor R is connected between the control terminal Vc and the anode of the diode D2. When a voltage applied to the control terminal Vc is about 0V, both of the diodes D1 and D2 are OFF, which allows a signal to be transmitted between the second input/output portion T2 and the first port P1. When a predetermined positive voltage is applied to the control terminal Vc, both of the diodes D1 and D2 are turned ON, allowing a signal to be transmitted between the first input/output portion T1 and the first port P1.

In this manner, by simply providing the single switch circuit SW, signals passing through the filters F1 and F2 can be switched. However, a signal attempting to pass through a filter that is not selected by the switch circuit SW may leak from the switch circuit SW. As a result, a signal at an unwanted frequency is likely to pass through the filter.

For example, when the diode D1 and D2 are ON, i.e., when the switch circuit SW selects the first input/output portion T1, and a GSM850 signal is input from the first port P1 and output from the second port P2, a signal in the 900 MHz band may be leaked from the switch circuit SW. The signal in the 900 MHz band may then pass through the second filter F2 and be leaked into the second port P2. As a result, the GSM900 signal is superimposed on the GSM850 signal.

In addition, when a signal is transmitted from the second port P2 to the first port P1, pass-through of a signal corresponding to a filter that is not selected by the switch circuit SW and leakage from the switch circuit SW may occur. Thus, a signal at an unwanted frequency is likely to be passed.

The phase adjusting circuit Ls in FIG. 2 is provided to overcome the above-described problem associated with the pass-through of signals at unwanted frequencies. When a signal in the 900 MHz band is input from the first port P1, this signal should not pass through the first filter F1 and should be reflected toward the first port P1. The phase of this reflected signal is adjusted by the phase adjusting circuit Ls. The phase adjusting circuit Ls performs phase adjustment such that the impedance in the 900 MHz band obtained when this filter module is seen from the first port P1 while the switch circuit SW selects the first input/output portion T1 is in a substantially short-circuited state.

In this manner, if the impedance at a predetermined frequency in the second frequency band (e.g., 900 MHz) is in a substantially short-circuited state when this filter module is seen from the first port P1 while the switch SW selects the first input/output portion T1, signal components in the 900 MHz band attempting to pass through the leakage of the second filter F2 and the switch circuit SW are prevented.

Figure 3A:
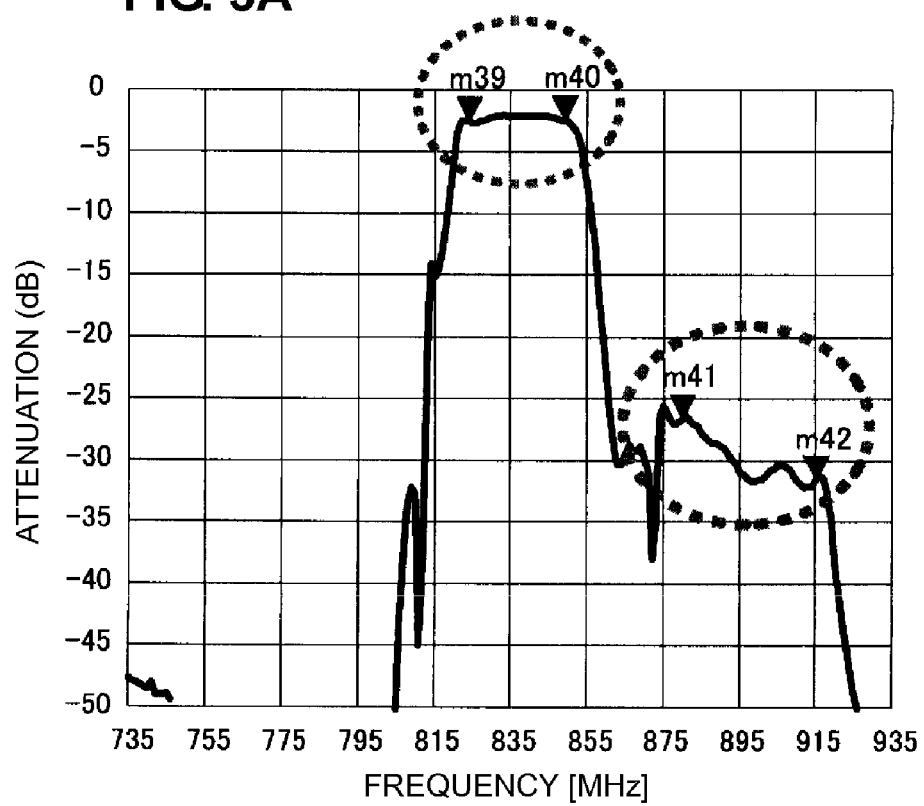
FIGS. 3A and 3B show characteristic diagrams obtained when a phase adjusting circuit of the filter module is not provided.
Figure 3B:
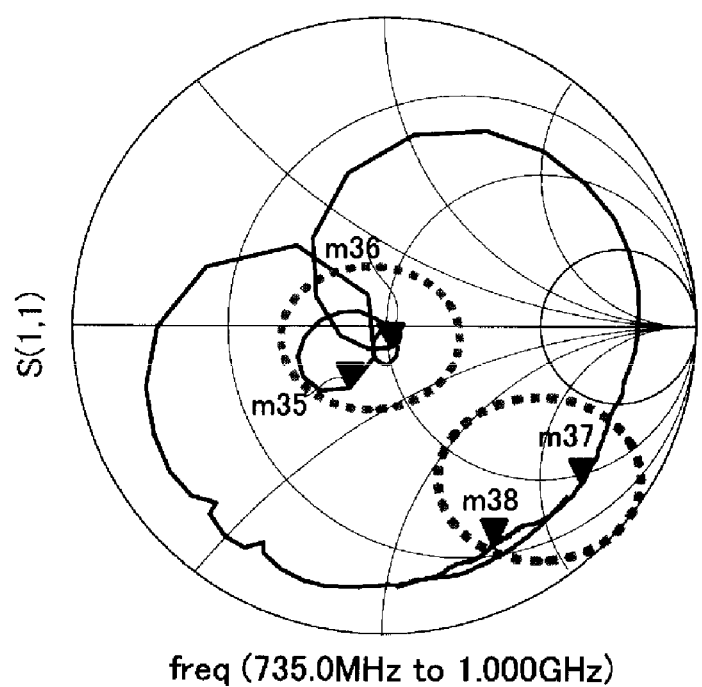
Figure 4A:
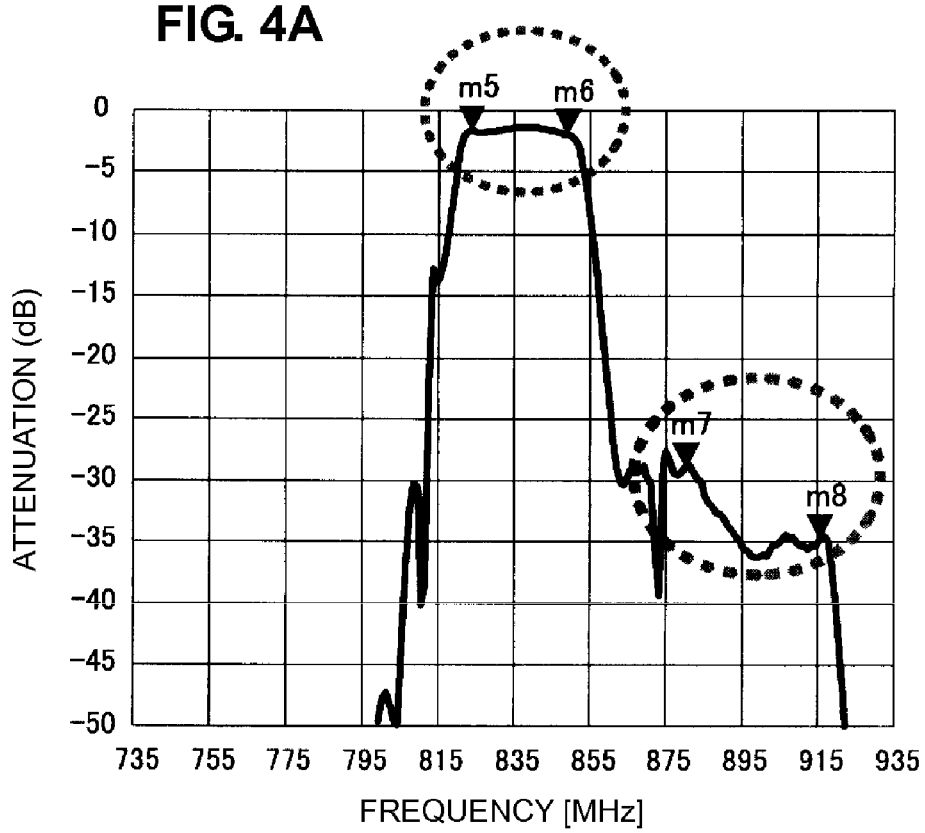
FIGS. 4A and 4B show characteristic diagrams obtained when a phase adjusting circuit of the filter module is provided.
Figure 4B:
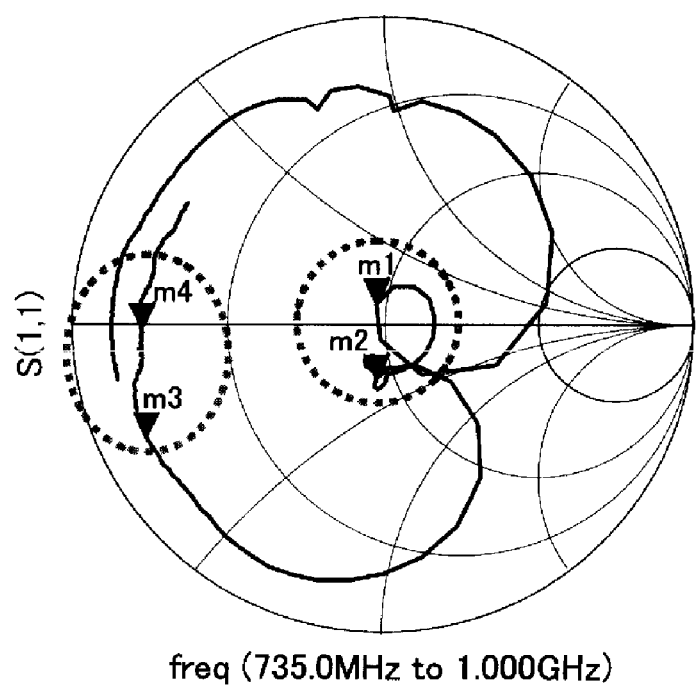

FIGS. 3A to 4B illustrate the effects of the phase adjusting circuit Ls. FIGS. 3A and 3B show characteristic diagrams obtained when the phase adjusting circuit Ls is not provided. FIGS. 4A and 4B show characteristic diagrams obtained when the phase adjusting circuit Ls is provided.

FIG. 3A and FIG. 4A show transmission characteristics between the first port P1 and the second port P2. FIG. 3B and FIG. 4B are diagrams illustrating a reflection characteristic obtained when this filter module is seen from the first port P1, i.e., a reflection coefficient S(1, 1) in the S parameter, is expressed by a Smith chart (impedance locus obtained by frequency sweeping).

Points m39, m35, m5, and m1 shown in FIGS. 3A to 4B indicate values at about 824 MHz. Points m40, m36, m6, and m2 indicate values at about 849 MHz. Points m41, m37, m7, and m3 indicate values at about 880 MHz. Further, points m42, m38, m8, and m4 indicate values at about 915 MHz.

As is apparent from a comparison of FIG. 3B and FIG. 4B, by providing the phase adjusting circuit Ls, the impedance locus on the Smith chart rotates clockwise by a predetermined angle (about 120 degrees in this example). As shown in FIG. 4B, signal components in the 900 MHz band are suppressed by phase adjustment, which is preferably performed such that the impedance in the 900 MHz band to be attenuated is substantially a short-circuited state, i.e., near the left end of the Smith cart. In this example, as expressed in the transmission characteristics shown in FIG. 3A and FIG. 4A, it can be seen that the attenuation in the 900 MHz band (center frequency about 898 MHz) is improved by approximately 3 dB.

On the other hand, since the first filter F1 passes signals in the 850 MHz band, the impedance in this frequency band is located around the reference impedance (the center on the Smith chart) and thus is not significantly affected by the phase adjustment performed by the phase adjusting circuit Ls. As can also be seen from the transmission characteristics shown in FIG. 3A and FIG. 4A, the insertion loss in the 850 MHz band (center frequency about 837 MHz) is not degraded.

The phase adjusting circuit Ls operates similarly for signals transmitted from the second port P2 to the first port P1. Specifically, among signals input from the second port P2, a 900 MHz band component passes through the second filter. However, such a component is substantially short-circuited at the output terminal of the switch circuit SW, and thus 900 MHz band signals can be prevented.

In the example shown in FIG. 2, the phase adjusting circuit Ls is preferably provided between the first input/output portion T1 of the switch circuit SW and the first filter F1. However, such an independent phase adjusting circuit Ls is not necessary as long as the impedance at a predetermined frequency in the second frequency band obtained when this filter module is seen from the first port P1 while the switch circuit SW currently selects the first input/output portion T1 is in a substantially short-circuited state. In other words, this condition can be achieved by appropriately setting an electrical length from the switch circuit SW to the first filter F1 and a circuit configuration of the switch circuit.

Figure 5A:
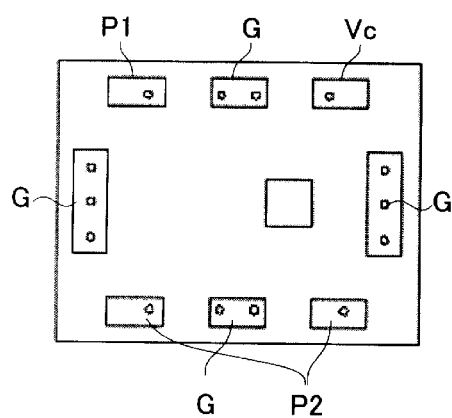
FIGS. 5A to 5H show diagrams illustrating conductor patterns of individual dielectric layers when the filter module is defined by a laminate of the dielectric layers.
Figure 7A:
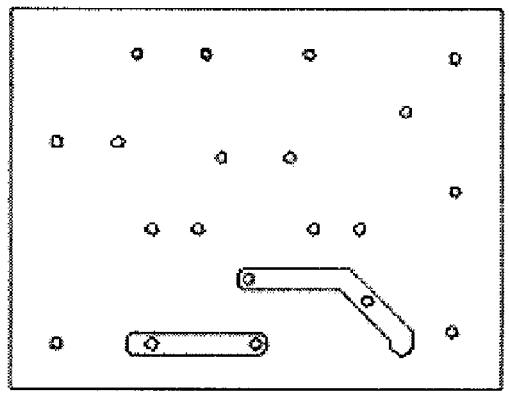
FIGS. 7A to 7C show diagrams illustrating conductor patterns of individual dielectric layers when the filter module is defined by a laminate of the dielectric layers.
Figure 7B:
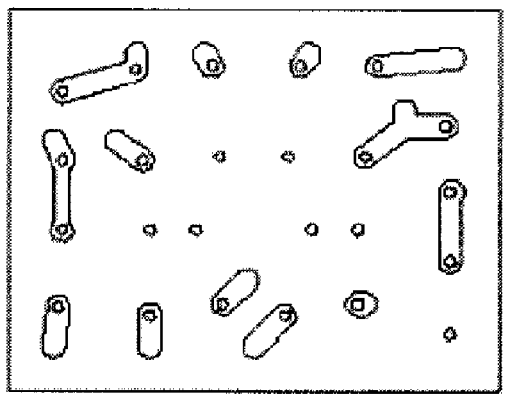
Figure 7C:
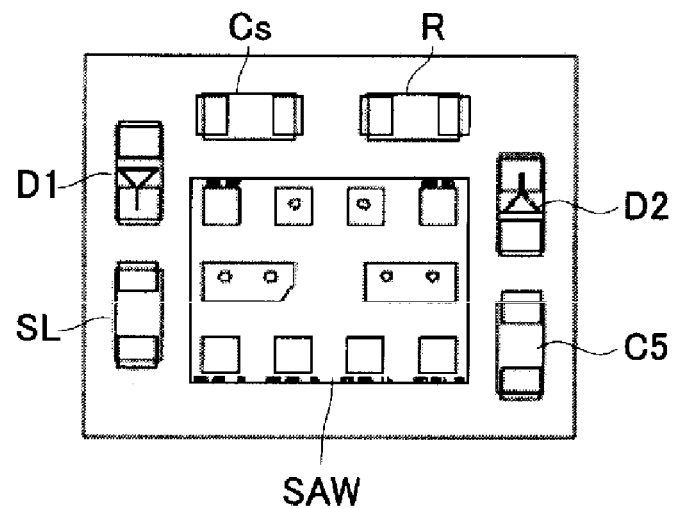

FIGS. 5A to 7C are diagrams illustrating a configuration of the filter module in which the filter module is integrated into a laminate of dielectric layers. Each of the diagrams is a plan view of a conductor pattern on the lower surface of each of a plurality of dielectric layers. FIG. 5A shows the bottom layer, and FIG. 7B shows the top layer. FIG. 7C is a plan view of the upper surface of the top layer including individual chips mounted thereon. To facilitate illustration, the layers of the laminate are illustrated in three figures from FIGS. 5A to 7C. In FIGS. 5A to 7C, GND indicates a ground electrode.

In FIG. 5A, P1 indicates a terminal of the first port, P2 indicates terminals of the second port, G indicates a ground terminal, and Vc indicates a control terminal.

Figure 5B:
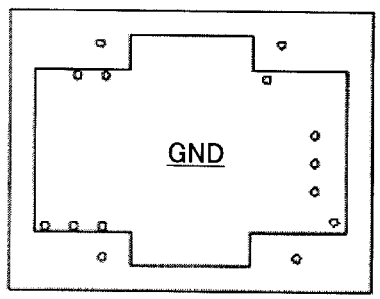
Figure 5C:
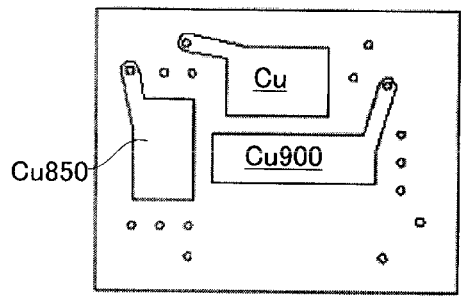
Figure 5D:
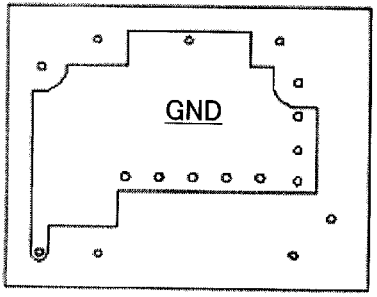
Figure 5E:
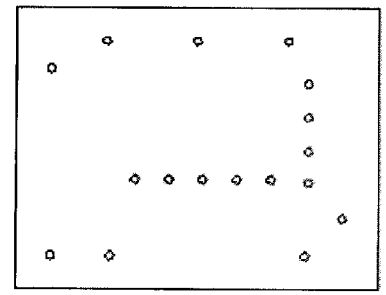
Figure 5F:
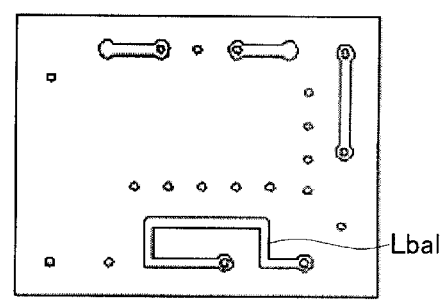
Figure 5G:
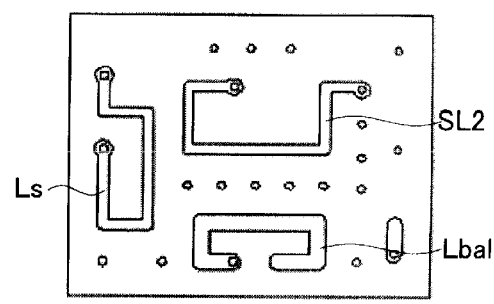
Figure 5H:
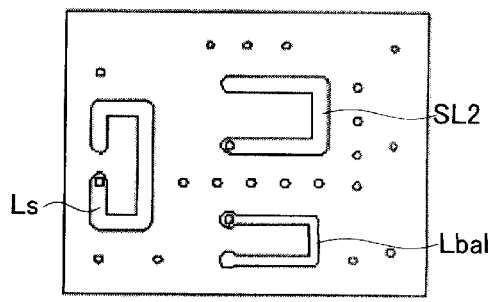
Figure 6A:
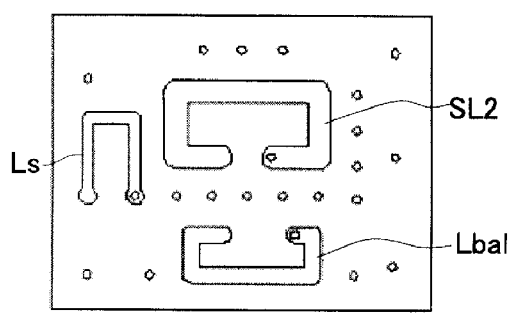
FIGS. 6A to 6G show diagrams illustrating conductor patterns of individual dielectric layers when the filter module is defined by a laminate of the dielectric layers.
Figure 6B:
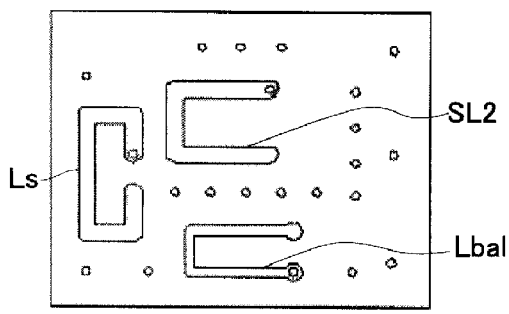
Figure 6C:
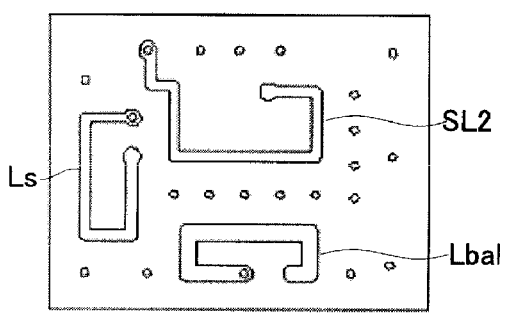
Figure 6D:
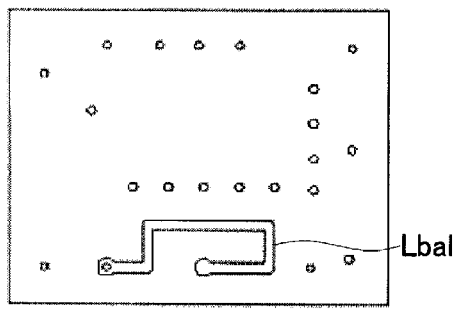
Figure 6E:
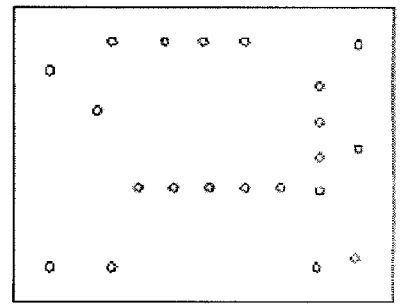
Figure 6F:
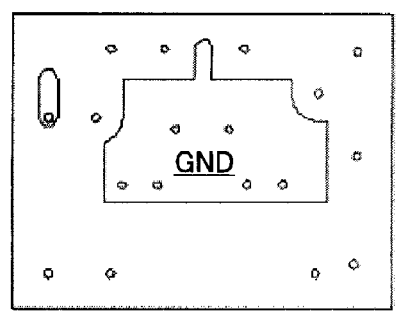
Figure 6G:
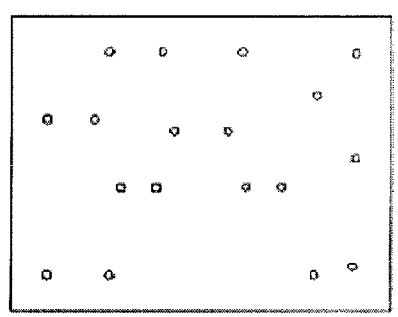

Conductor patterns Cu, Cu900, and Cu850 in FIG. 5C are opposed to the ground electrodes GND in FIGS. 5B and 5D and define the capacitors Cu, Cu900, and Cu850, respectively.

As shown in FIG. 7C, a surface acoustic wave filter SAW in which the first filter F1 that passes the 850 MHz band and the second filter F2 that passes the 900 MHz are integrated into a single device, a chip inductor SL, chip capacitors Cs and C5, diodes D1 and D2, and a chip resistor R are mounted on the upper surface of the laminate.

Note that a thickness extensional vibration piezoelectric filter may be used in place of the surface acoustic wave filter.

Second Preferred Embodiment

Figure 8:
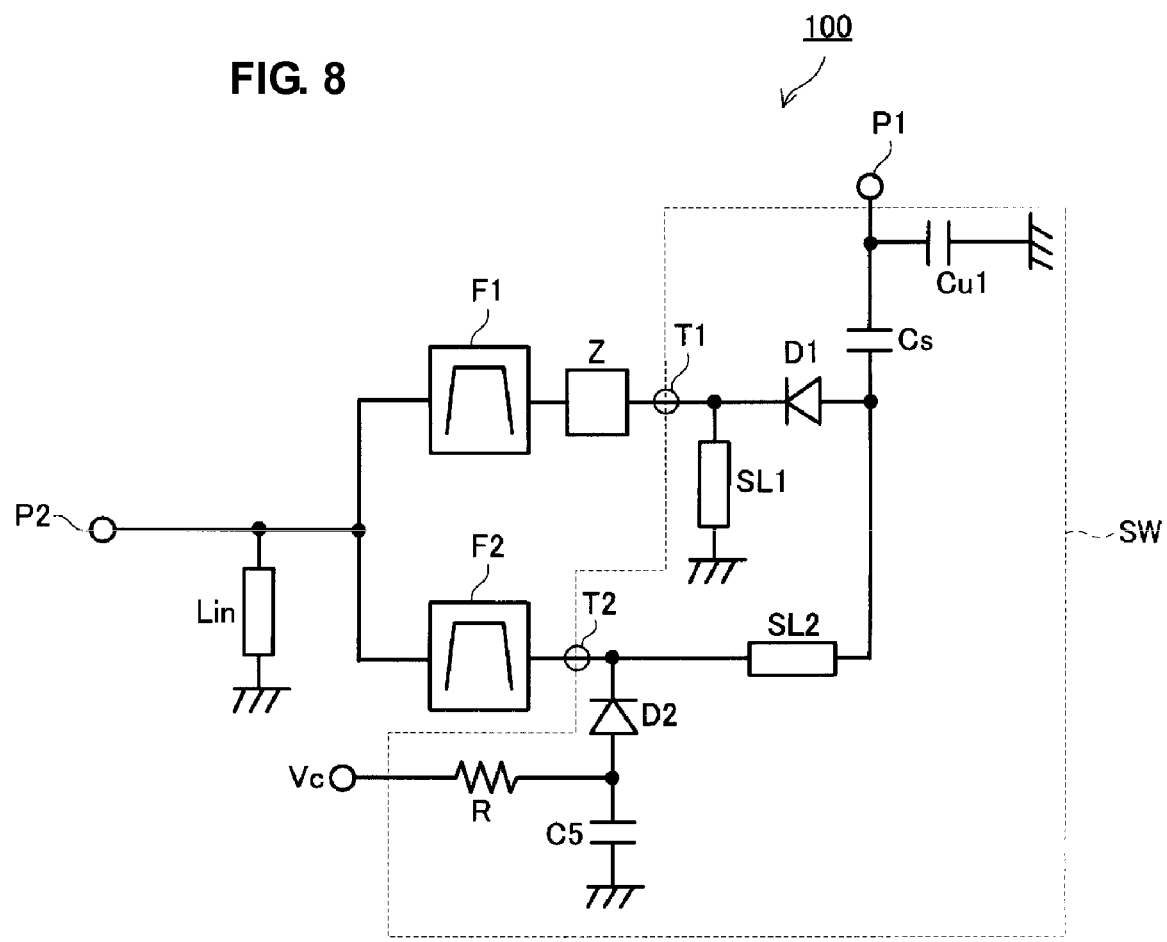
FIG. 8 is a circuit diagram illustrating a filter module according to a second preferred embodiment of the present invention.

FIG. 8 is a circuit diagram of a filter module according to a second preferred embodiment of the present invention. This filter module 100 includes a first input/output port P1 arranged to input and output a signal in an unbalanced state, a second input/output port P2 arranged to input and output a signal in an unbalanced state, and a control terminal Vc arranged to switch frequency bands. The filter module 100 primarily includes a first filter F1, a second filter F2, and a switch circuit SW.

The switch circuit SW includes a common input/output portion connected to the first port P1, a first input/output portion T1, and a second input/output portion T2. The first filter F1 passes a signal in a first frequency band (e.g., 850 MHz) and is provided between the first input/output portion T1 of the switch circuit SW and the second port P2. The second filter F2 passes a signal in a second frequency band (e.g., 900 MHz) and is provided between the second input/output portion T2 of the switch circuit SW and the second port P2.

A phase adjusting circuit Z is provided between the first input/output portion T1 and the first filter F1. A matching element (e.g. an inductor) Lin is provided between the second port P2 and ground.

A diode D1 is provided in series between the first input/output portion T1 of the switch circuit SW and the first port P1 via a capacitor Cs. A stripline SL1 defining a path to apply a direct current control voltage is provided between the cathode side of the diode D1 and ground. A matching capacitor Cu1 is provided at the first port P1.

A diode D2 is provided between the second input/output portion T2 and ground and is connected to a shunt via a capacitor C5. A stripline SL2 for phase adjustment is provided between the connection point of the anode of the diode D1 and the capacitor Cs, and the cathode of the diode D2.

A resistor R is connected between the control terminal Vc and the anode of the diode D2. When a voltage applied to the control terminal Vc is about 0V, both of the diodes D1 and D2 are OFF, which allows a signal to be transmitted between the second input/output portion T2 and the first port P1. When a predetermined positive voltage is applied to the control terminal Vc, both of the diodes D1 and D2 are turned ON, allowing a signal to be transmitted between the first input/output portion T1 and the first port P1.

Figure 9A:
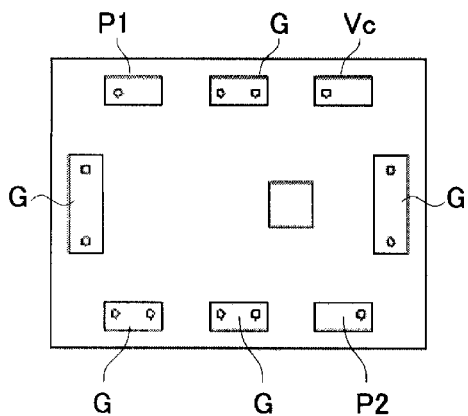
FIGS. 9A to 9H show diagrams illustrating conductor patterns of individual dielectric layers when the filter module is defined by a laminate of the dielectric layers.
Figure 11A:
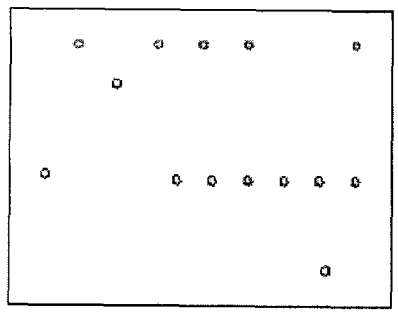
FIGS. 11A to 11E show diagrams illustrating conductor patterns of individual dielectric layers when the filter module is defined by a laminate of the dielectric layers.
Figure 11E:
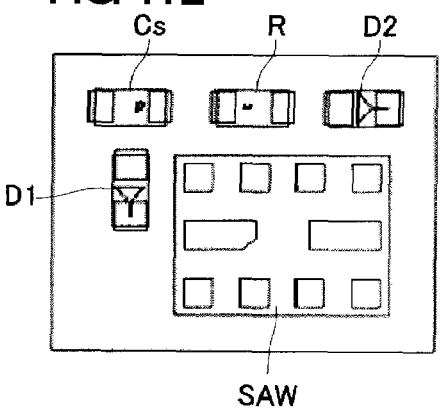
Figure 11B:
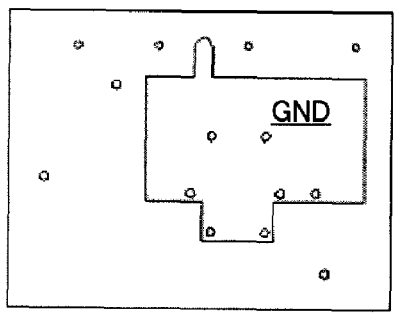
Figure 11C:
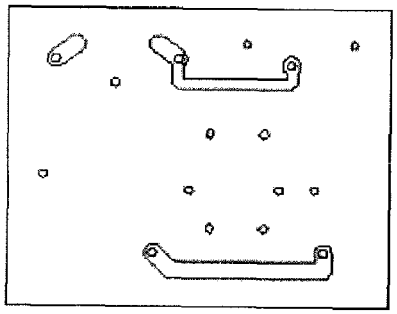

FIGS. 9A to 11E show diagrams illustrating a configuration of the filter module in which the filter module is integrated into a laminate of dielectric layers. Each of the diagrams is a plan view of a conductor pattern on the lower surface of each of a plurality of dielectric layers. FIG. 9A shows the bottom layer, and FIG. 11D shows the top layer. FIG. 11E is a plan view of the upper surface of the top layer which includes individual chips mounted thereon. To facilitate illustration, the layers are illustrated in three figures from FIG. 9A to FIG. 11E. In FIGS. 9A to 11E, reference signs in the figures correspond to the reference signs in the circuit shown in FIG. 8. In addition, GND indicates a ground electrode.

In FIG. 9A, P1 indicates a terminal of the first port, P2 indicates a terminal of the second port, G indicates a ground terminal, and Vc indicates a control terminal.

Figure 9E:
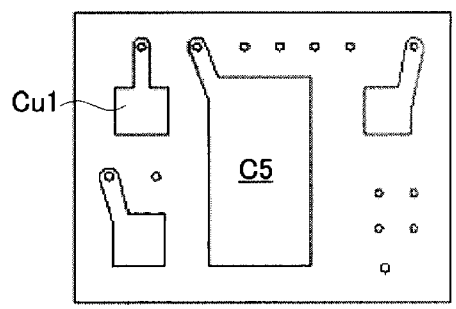
Figure 9B:
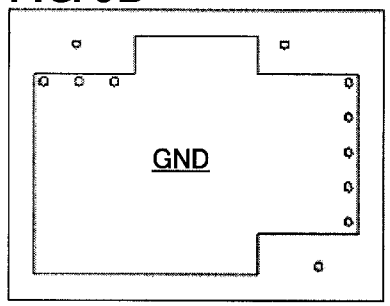
Figure 9F:
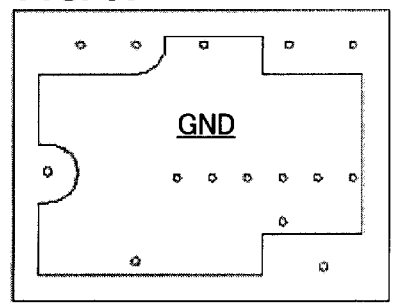
Figure 9C:
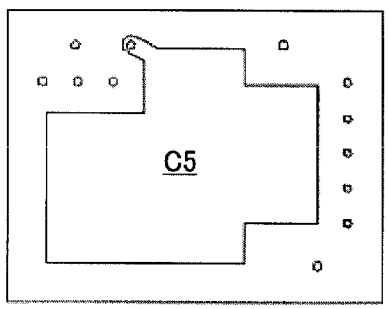
Figure 9G:
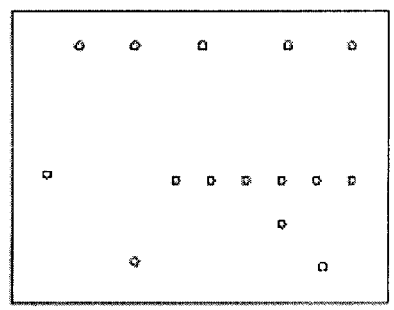
Figure 9D:
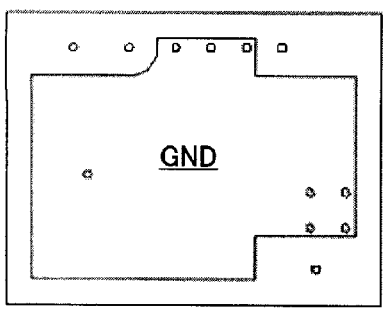
Figure 9H:
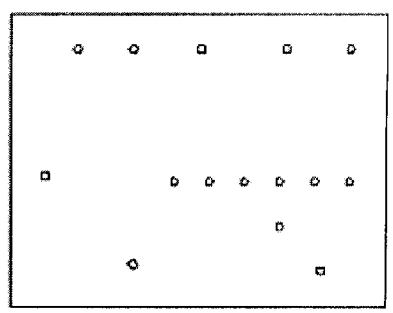
Figure 10A:
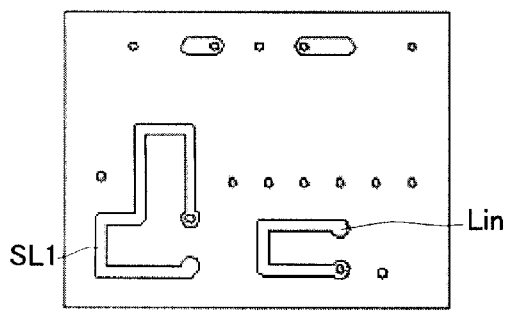
FIG. 10A to 10G show diagrams illustrating conductor patterns of individual dielectric layers when the filter module is defined by a laminate of the dielectric layers.
Figure 10E:
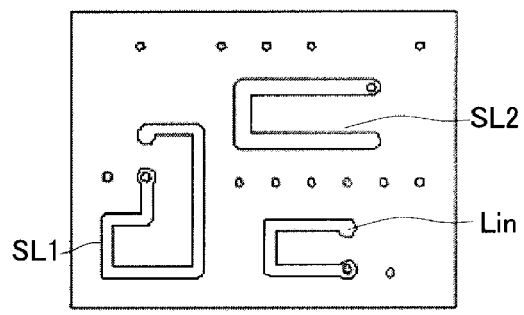
Figure 10B:
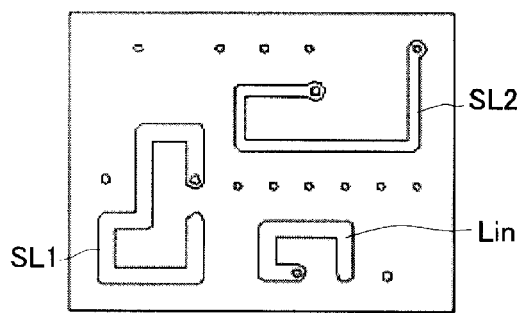
Figure 10F:
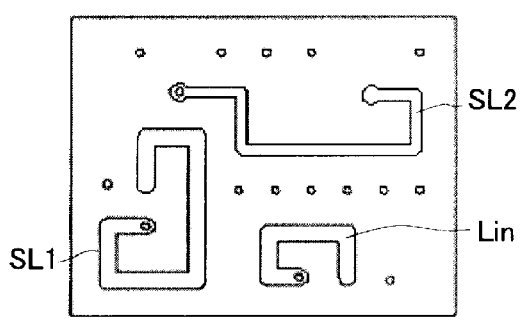
Figure 10C:
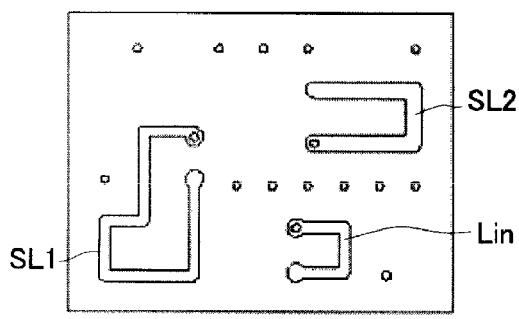
Figure 10G:
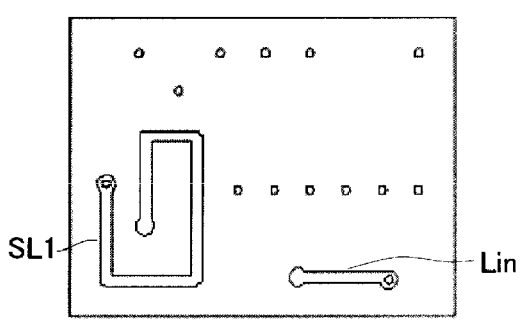
Figure 10D:
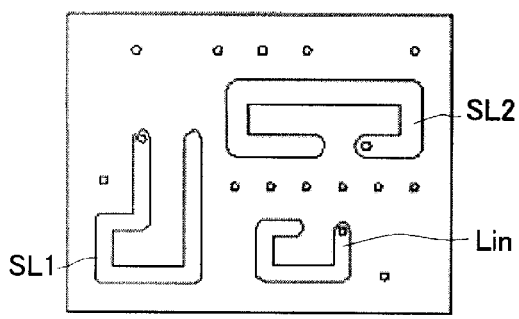

Conductor patterns C5 in FIGS. 9C and 9E are opposed to the ground electrodes GND in FIGS. 9B, 8D, and 9F and define the capacitor C5.

As shown in FIG. 11E, a surface acoustic wave filter SAW in which the first filter F1 arranged to pass the 850 MHz band and the second filter F2 arranged to pass the 900 MHz band are integrated as a single device, a chip capacitor Cs, diodes D1 and D2, and a chip resistor R are mounted on the upper surface of the laminate.

Figure 11D:
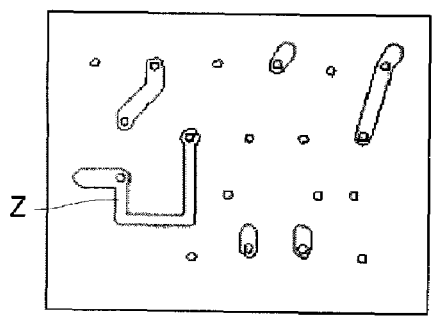

A phase adjusting circuit Z defined by a transmission line is provided on the layer shown in FIG. 11D. This phase adjusting circuit Z is disposed on a layer that is independent of layers including capacitors and inductors defining the switch circuit SW. Thus, the various elements of the switch circuit do not adversely affect the phase adjusting circuit Z, and the phase adjusting circuit Z does not adversely affect other circuits. Thus preset phase adjustment is enabled.

In the first and second preferred embodiments, the phase adjusting circuit is preferably defined by a transmission line connected in series with a signal transmission path. However, other configurations may be used. For example, the phase adjustment may also be defined by providing a capacitor connected to a shunt between a line and ground. It is also possible to combine both of these configurations. Furthermore, instead of the configuration in which a transmission line, a capacitor, an inductor, or other suitable element defining the phase adjusting circuit is defined by a conductive pattern in a laminate of dielectric layers, the phase adjusting circuit defined by a chip inductor and a chip capacitor mounted on the laminate.

In addition, in the examples described in the first and second preferred embodiments, pass-through of signals in the 900 MHz band is suppressed while the 850 MHz is selected. However, the preferred embodiments may be similarly applied when a phase adjusting circuit is provided between the second filter F2 passing the 900 MHz band and the switch circuit SW, such that the pass-through of signals in the 850 MHz band is suppressed while the 900 MHz band is selected.

Third Preferred Embodiment

Figure 12:
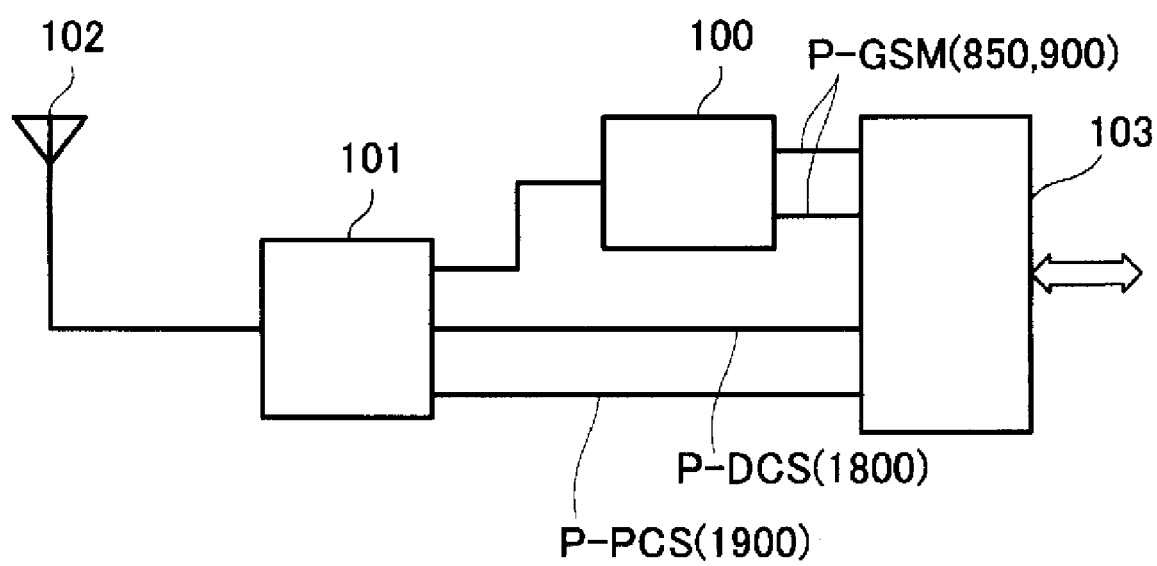
FIG. 12 is a diagram illustrating a configuration of a communication apparatus according to a third preferred embodiment of the present invention.

FIG. 12 illustrates a configuration of a high-frequency circuit portion of a quadband mobile phone. This high-frequency circuit portion includes a triple-band chip set 103, a balanced-unbalanced filter module 100, a triple-band antenna switch module 101, and an antenna 102. The antenna switch module 101 is an antenna switch for GSM900/DCS1800/PCS1900, and the antenna 102 is shared for these frequency bands. The filter module 100 is connected to a GSM port, and GSM850 and GSM900 are switched using this filter module 100. The triple-band chip set 103 is a chip set for GSM900/DCS1800/PCS1900 and operates as an RF (high-frequency) front-end circuit for these the bands. It is also possible to configure a mobile phone by connecting a baseband chip (not shown) to the triple-band chip set 103 and providing an input/output portion in the baseband chip.

In this example, the balanced input/output port of the filter module 100 is indicated by two terminals since it performs balanced input/output for GSM850 and GSM900.

In this manner, a quadband mobile phone device can be easily configured by providing a high-frequency circuit in which the triple-band chip set 103 and the filter module 100 described in the first preferred embodiment, for example, are combined.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A filter module comprising:
    a switch circuit including first and second input/output portions and a common input/output portion, the common input/output portion being connected to a first port;
    a first filter disposed between the first input/output portion of the switch circuit and a second port, the first filter passing a signal in a first frequency band; and
    a second filter disposed between the second input/output portion of the switch circuit and the second port, the second filter passing a signal in a second frequency band; wherein
    an impedance in the second frequency band as seen from the first port while the switch circuit selects the first input/output portion is in a substantially short-circuited state.

2. The filter module according to claim 1, wherein the first and second filters include a balanced to unbalanced conversion function, the second port is a balanced terminal, and the first and second filters input and output signals to and from the second port in a balanced state.

3. The filter module according to claim 1, wherein the switch circuit is integrated into a laminate including a plurality of dielectric layers, and the first and second filters are one of surface acoustic wave filters and thickness extensional vibration piezoelectric filters mounted on the laminate.

4. The filter module according to claim 1, wherein a phase adjusting circuit is provided between the first input/output portion of the switch circuit and the first filter, the phase adjusting circuit causes an impedance in the second frequency band as seen from the first port while the switch circuit selects the first input/output portion to be substantially short-circuited.

5. The filter module according to claim 4, wherein the phase adjusting circuit includes one of a transmission line, a capacitor, and an inductor.

6. The filter module according to claim 4, wherein the switch circuit includes a capacitor and an inductor, the phase adjusting circuit includes a transmission line, and the transmission line of the phase adjusting circuit is disposed on a different layer from a layer having the capacitor or the inductor of the switch circuit disposed thereon.

7. A communication apparatus comprising a high frequency portion and the filter module according to claim 1 provided in the high-frequency circuit portion thereof.

* * * * *